United States Patent [19]
Booth

[11] Patent Number: 5,434,456
[45] Date of Patent: Jul. 18, 1995

[54] LUMPED TRANSMISSION LINE AVALANCHE PULSER

[75] Inventor: Rex Booth, Livermore, Calif.

[73] Assignee: The Regents of the University of California, Oakland, Calif.

[21] Appl. No.: 15,105

[22] Filed: Feb. 9, 1993

[51] Int. Cl.$^6$ .............................. H04L 27/04
[52] U.S. Cl. ...................... 307/108; 333/26
[58] Field of Search ............... 363/59, 60, 61; 307/106–109, 260, 302, 264, 268; 328/59, 65, 67; 333/20, 26

[56] References Cited

U.S. PATENT DOCUMENTS

| | | | |
|---|---|---|---|
| 3,075,092 | 1/1961 | Dill | 307/261 |
| 3,135,876 | 11/1961 | Embree et al. | 328/59 |
| 3,263,098 | 7/1966 | Marks et al. | 307/266 |
| 3,555,301 | 1/1971 | Hansen | 307/246 |
| 3,665,222 | 5/1972 | Gatwood | 307/283 |
| 3,742,383 | 6/1973 | Hollis | 331/111 |
| 5,003,191 | 3/1991 | Boyle et al. | 307/109 |
| 5,216,695 | 6/1993 | Ross et al. | 333/26 |

*Primary Examiner*—Jeffrey A. Gaffin
*Assistant Examiner*—Peter Ganjoo
*Attorney, Agent, or Firm*—Henry P. Sartorio

[57] ABSTRACT

A lumped linear avalanche transistor pulse generator utilizes stacked transistors in parallel within a stage and couples a plurality of said stages, in series with increasing zener diode limited voltages per stage and decreasing balanced capacitance load per stage to yield a high voltage, high and constant current, very short pulse.

14 Claims, 7 Drawing Sheets

LUMPED TRANSMISSION LINE AVALANCHE PULSER

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The invention relates generally to the field of pulse generators and more specifically to pulse generators which produce very high voltage, current, and power pulses of very brief duration. More particularly, the invention discloses a lumped transmission line oriented pulse generator and pulse shaper utilizing the summed power output of a series of stages wherein each stage consists of at least one avalanche transistor, a decreasing capacitance per stage and a power source for the transistor stages coupled through a respective resistance and zener diode network.

2. Description of Related Art

Figure 1:
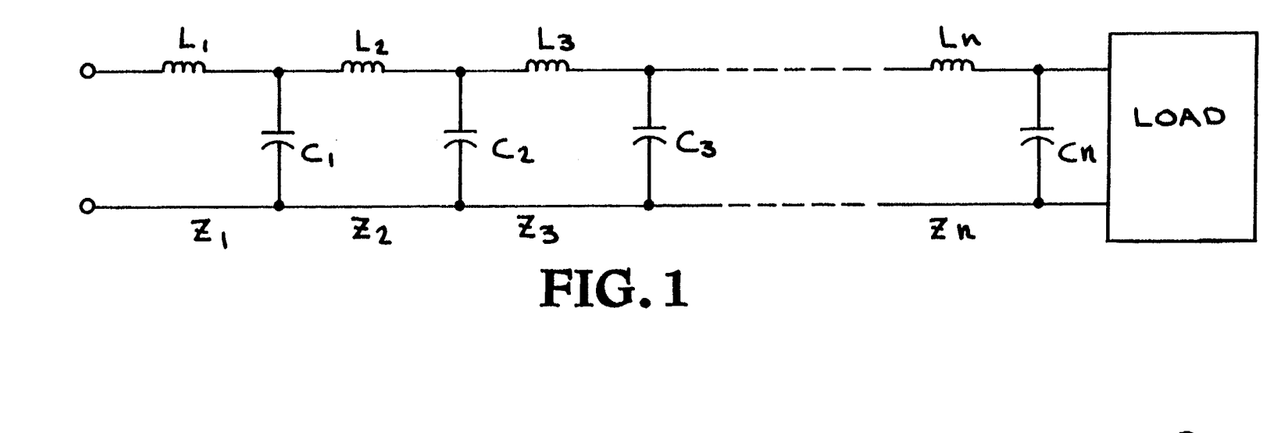
FIG. 1 is a schematic for a prior art "lumped" or distributed transmission line.

Avalanche pulse devices have been in general use for some time as have lumped delay lines as specialized transmission lines in which line parameters are adjusted to decrease the velocity of signal transmission. In a lumped-constant delay line, the normally distributed inductance and capacitance per unit length, that one sees in a lengthy transmission line, is synthetically reproduced by a plurality of individual stages coupled in series, wherein each individual stage consists of an inductor and capacitor combination coupled in a low pass filter configuration as illustrated in FIG. 1.

Figure 2:
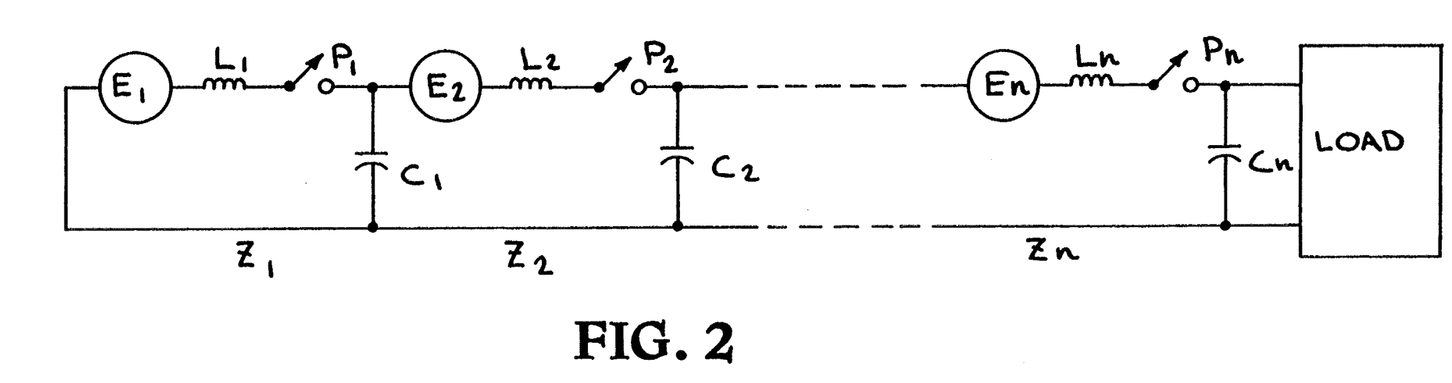
FIG. 2 is a schematic for a prior art capacitively loaded "lumped" pulser string.

Applicant's pulse generator somewhat parallels the lumped transmission line concept by coupling a plurality of stages in series, wherein the inductor in each stage of the transmission line is replaced by a power source in series with an avalanche transistor, which transistor inherently carries an inductance, and together with a respective capacitor acts like a very fast switch, illustrated in FIG. 2.

Prior art pulse generating circuits utilizing avalanche transistors and tunnel diodes have been implemented in the past to develop high power pulses at high repetition rates. Such pulse generating circuits utilizing avalanche transistors conventionally require a storage capacitor coupled in the load current path for limiting the peak current during avalanche multiplication so as to prevent damage to the transistor. Traditional setups require the transistor to be biased to an avalanche operating point by a power supply and biasing resistor coupled in series to a point between the capacitor and the load current circuit of the transistor. The capacitor conventionally recharges after formation of each output pulse by current flowing through a biasing resistor from the power supply.

Although the prior art pulse generator described included a plurality of sequentially operating pulse generator stages wherein each stage includes an avalanche transistor, the stages were coupled in parallel, not in series like the present invention, and for the purpose of increasing pulse repetition rates as opposed to applicant's intent to substantially increase power regardless of repetition rate. Such prior art in fact teaches away from applicant's concept.

Other pulse generators using strings of avalanche transistors have been around for a long time. Strings of avalanche transistors were used by applicant in an accelerator beam sweeper as early as 1970 and strings of avalanche transistor pulsers have been produced by Kentec, a British Company, which produce 5 kV pulses with 100 picosecond widths.

In still other circuits pairs of avalanche transistors in series have been utilized as a pulse shaping device with the output of a second transistor cutting short the output of a first transistor. Other avalanche transistor string circuits have been designed for generating variable delay pulses; however, such circuits again were of a parallel circuit design.

Although other parallel and series coupled avalanche transistor pulse generators have been conceived with capacitors to build up current to add power to a pulse, the current and voltage limitations inherent in all the prior art continues to necessitate a pulse generator of even greater capacity such as the type disclosed herein.

In none of the prior art was there any disclosure nor suggestion to stack multiple avalanche transistors in parallel to enable a large current flow, then couple the stacks in a series of stages to combine all the current flow, and shunting a plurality of RC balanced capacitors in parallel through the stages to enable the avalanche transistor to turn on hard with high and constant current flow.

SUMMARY OF THE INVENTION

In accordance with the long standing need for a pulse generator capable of delivering a high voltage, high and constant current pulse of brief duration, the invention disclosed herein comprises a plurality of stages coupled in series, each stage having at least one avalanche transistor with the base tied to the emitter. In variations with more than one transistor per stage, each transistor within a stage is coupled in parallel. Each stage is coupled in series, collector to emitter, with each succeeding stage, and each stage is also coupled through a PC board pad capacitor to a common lead wherein the capacitance diminishes in value from the initial stage to the terminal/output stage by diminishing the pad size. A power supply is coupled through a series of alternating resistors and zener diodes, a pair per stage, to the collector lead of each stage, yielding an increasing voltage on each stage from the initial stage to the terminal stage concomitant with the decreasing capacitance per stage.

Objects of the Invention

By such means it is a primary object of the invention to provide an improved higher power stringed avalanche transistor pulser than exists in the art at present.

Another object of the invention is to provide for a high current pulse generator by using multiple avalanche transistors stacked in parallel within a plurality of series coupled stacks or stages to allow a substantial amount of current flow.

Yet another object of the invention is to provide for a high voltage pulse generator with decreasing capacitance per stage in a chain of avalanche transistor stages, thereby decreasing the RC time constant to yield a very brief pulse output.

Still another object of the invention is to utilize a string of avalanche transistors in series with a zener diode voltage limiting power source to yield a high voltage output.

Yet another object is to use a decreasing capacitive loaded string of several stages of avalanche transistors to achieve a very fast switching speed.

Yet another object is to utilize a relatively large capacitor in the initial stage to make the first stage avalanche transistors turn on hard with a low dynamic impedance and high current source, and with an increasing dynamic impedance for succeeding stages.

A further object of the invention is to provide for a stringed avalanche transistor pulse generator capable of yielding very brief flat topped pulses with low heat dissipation in the transistor string.

Other objects and features of the invention will become apparent to those skilled in the art as the disclosure is made in the following detailed description of the invention as illustrated in the accompanying drawings.

DETAILED DESCRIPTION OF THE INVENTION

In an effort to explain the theory behind and development of the invention, reference is first made to FIG. 1, where total inductance and capacitance of a length of transmission line can be generally illustrated in a lumped transmission line schematic as illustrated. In a lumped transmission line, total inductance (L), capacitance (C), and impedance (Z) of a length of transmission line may be illustrated in a linear summed series of groups or stages of individual inductances, capacitances and impedances: $L_1C_1Z_1$, $L_2C_2Z_2$, $L_3C_3Z_3$, and so forth up to $L_nC_nZ_n$ where $$Z_n = \sqrt{\frac{L_n}{C_n}}.$$

By analogy, FIG. 2, illustrates a similar lumped transmission line pulse generator consisting of a chain of individual power sources (E), inductance (L), switches (P), capacitance (C), and impedance (Z). Again the linear pulse generator circuit consists of a plurality of summed stages: $E_1L_1P_1C_1Z_1$, $E_2L_2P_2C_2Z_2$, and so forth up to $E_nL_nP_nC_nZ_n$.

The power source $E_1$ in a first stage charges capacitor $C_1$ when switch $P_1$ is closed and causes a current pulse to pass through inductor $L_1$ and across an impedance $Z_1$. Correspondingly in a second stage, $E_2$ charges up $C_2$ on $P_2$ closing, and causes a current pulse to pass through $L_2$ and across $Z_2$ to be summed with the pulse from the first stage and so forth on through the $N^{th}$ stage, which yields a summed pulse to the load.

Figure 3:
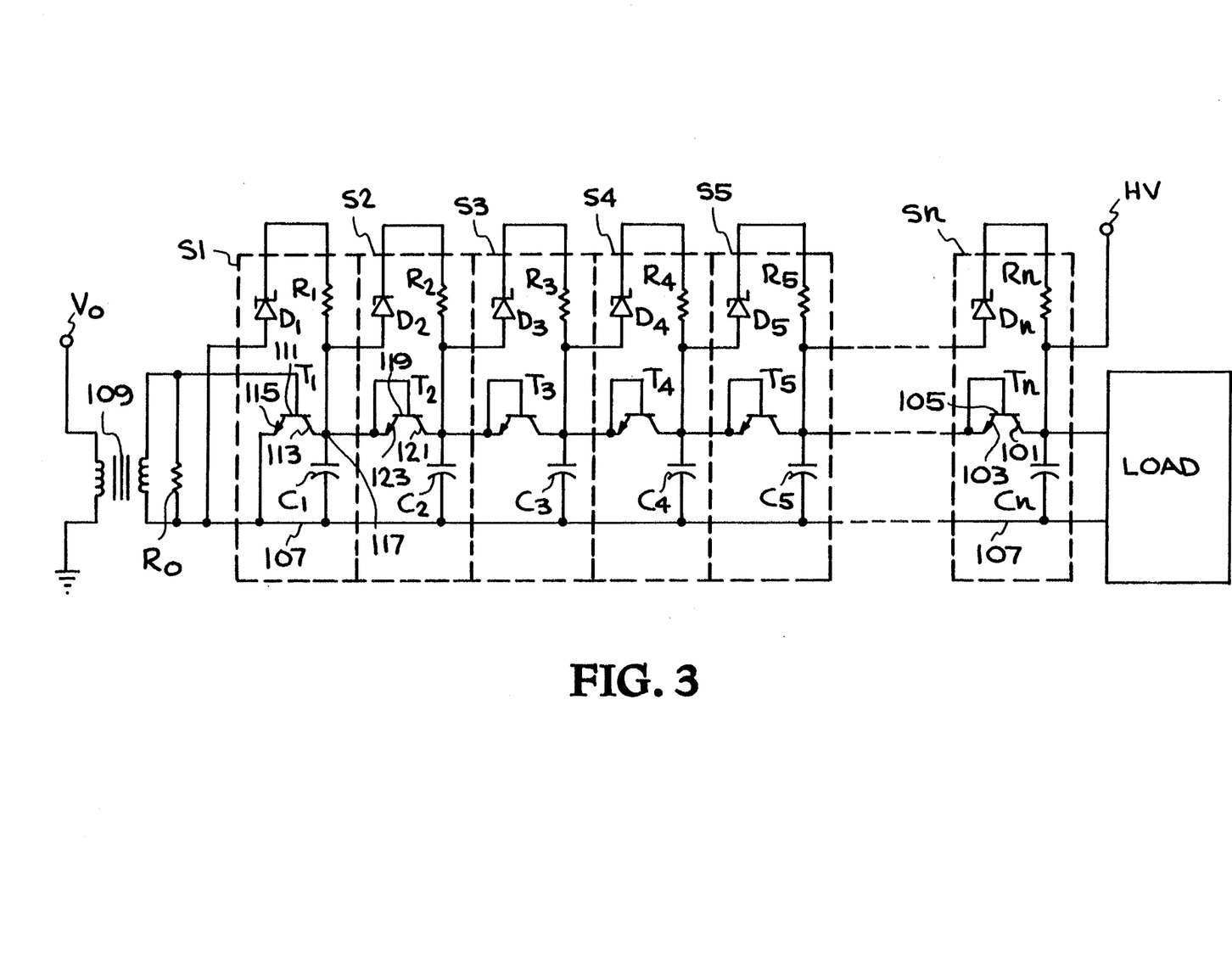
FIG. 3 is a schematic for a capacitively loaded "lumped" avalanche transistor pulser string of "n" stages

Applicant's basic invention concept is illustrated in the schematic of FIG. 3 which somewhat parallels the elementary pulser string circuit of FIG. 2. In FIG. 3 a plurality of stages $S_1$, $S_2$, $S_3$, $S_4$, $S_5$ and so forth up to $S_n$, indicated by dashed lines, are coupled in series and comprise a pulser string. Each stage $S_n$ consists of an avalanche transistor $T_n$, a capacitor $C_n$, a zener diode $D_n$ and resistor $R_n$. The collector 101 of each transistor $T_n$ is coupled in series to the emitter 103 of each succeeding transistor $T_{n+1}$, the emitter 103 of each transistor $T_n$ is coupled in series to the collector 101 of each preceding transistor $T_{n-1}$ and the base 105 is coupled to the emitter of the same transistor $T_n$. A capacitor $C_n$ in each stage $S_n$ connects the collector 101 of each transistor $T_n$ to a common lead 107. A zener diode $D_n$ in each stage $S_n$ connects the collector 101 and capacitor $C_n$ to a voltage produced by connecting the last stage to a high voltage power source HV. A resistor $R_n$ couples diode $D_n$ to a preceding diode ($D_{n-1}$) which in turn delivers power to a preceding transistor ($T_{n-1}$). The series of resistors $R_1$ to $R_n$ (which diodes $D_1$ to $D_n$) form a simple voltage divider to provide a voltage drop across each stage. In the first stage $S_1$, zener diode $D_1$ creates a 310 voltage drop across transistor $T_1$, and an additional 310 voltage drop across each succeeding stage.

A trigger pulse at $V_o$ is applied across a transformer 109 and initial biasing resistor $R_o$ to the base 111 of the first stage transistor $T_1$. Because a relatively large capacitor $C_1$ has been fully charged from power source HV through resistor $R_1$, avalanche transistor $T_1$ turns on hard, conducting a volume of current from collector 113 through emitter 1115. Transistor $T_1$ appears to short circuit at terminal 117, and pulls down the potential of base 119 of avalanche transistor $T_2$ which in turn discharges its capacitor $C_2$ through collector 121 and emitter 123, through $T_1$ to common lead 107.

Each succeeding stage, $S_3$, $S_4$, $S_5$, and so forth up to $S_n$, follows the first and second stages in like manner. When the base and emitter of $T_3$ are pulled down seeing a short circuit through $T_1$ and $T_2$, a chain reaction or cascading type effect is created where the high voltage input across each succeeding zener diode $D_2$, $D_3$, $D_4$, and resistor $R_1$, $R_2$, $R_3$, and $R_4$ and so forth up to $D_n$ and $R_n$ increases from approximately 350 to a maximum of 2500 volts in an eight stage avalanche pulser with a 100 amp current throughput.

Figure 4:
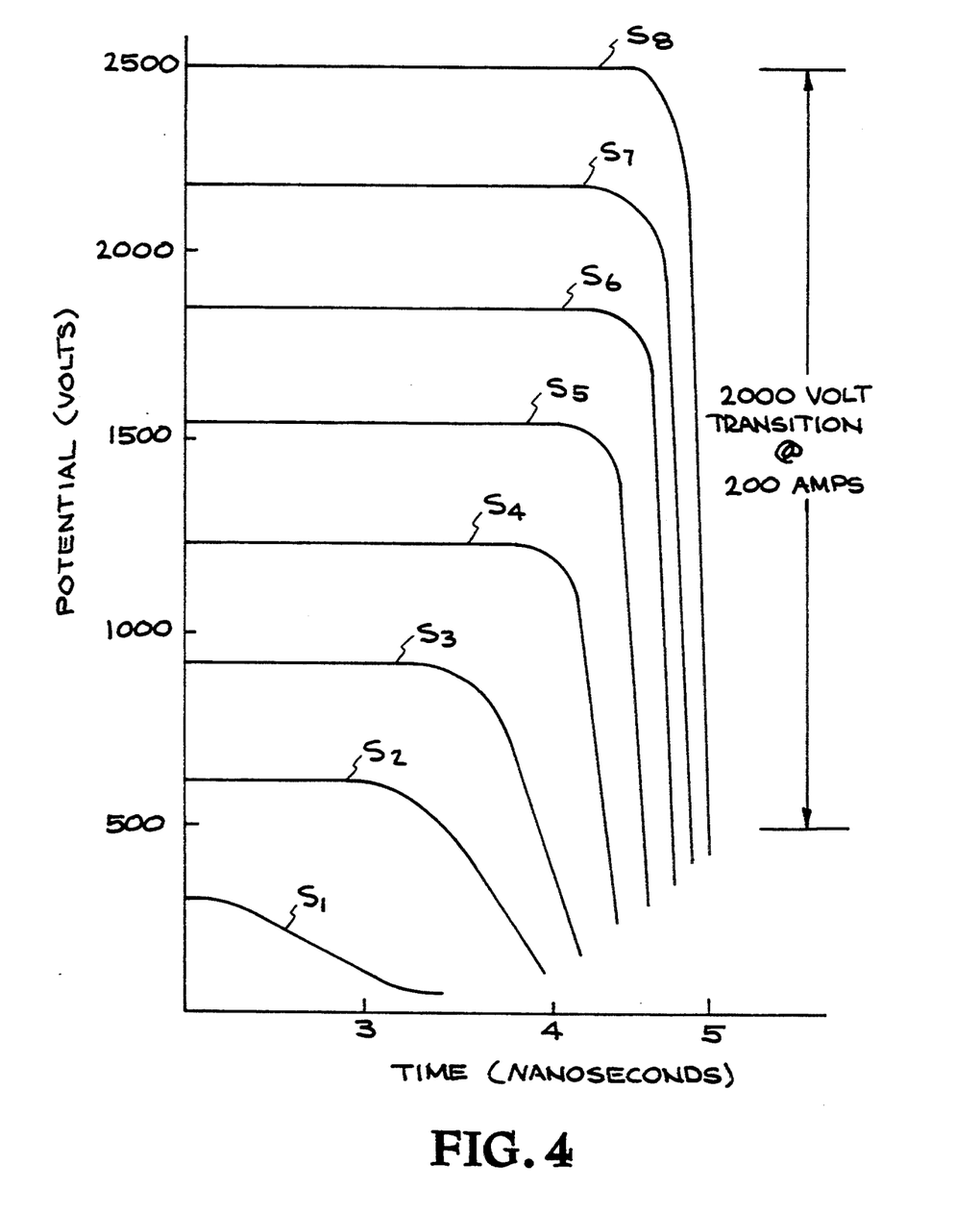
FIG. 4 is a graph of voltage at each stage of an avalanche transistor pulser string of eight stages.

Referring to FIG. 4, a graph is provided for such an eight stage stringed avalanche transistor pulser indicating the typical voltage level at which each stage kicks on as a function of time. Stage one kicks on at around 300 volts, stage two kicks on at around 600 volts, stage three at 900 volts, stage four at 1200 volts and so forth, yielding a total pulsed output of a 2000 volt transition at 100 amps with a 5 nanosecond (ns) period.

Figure 5:
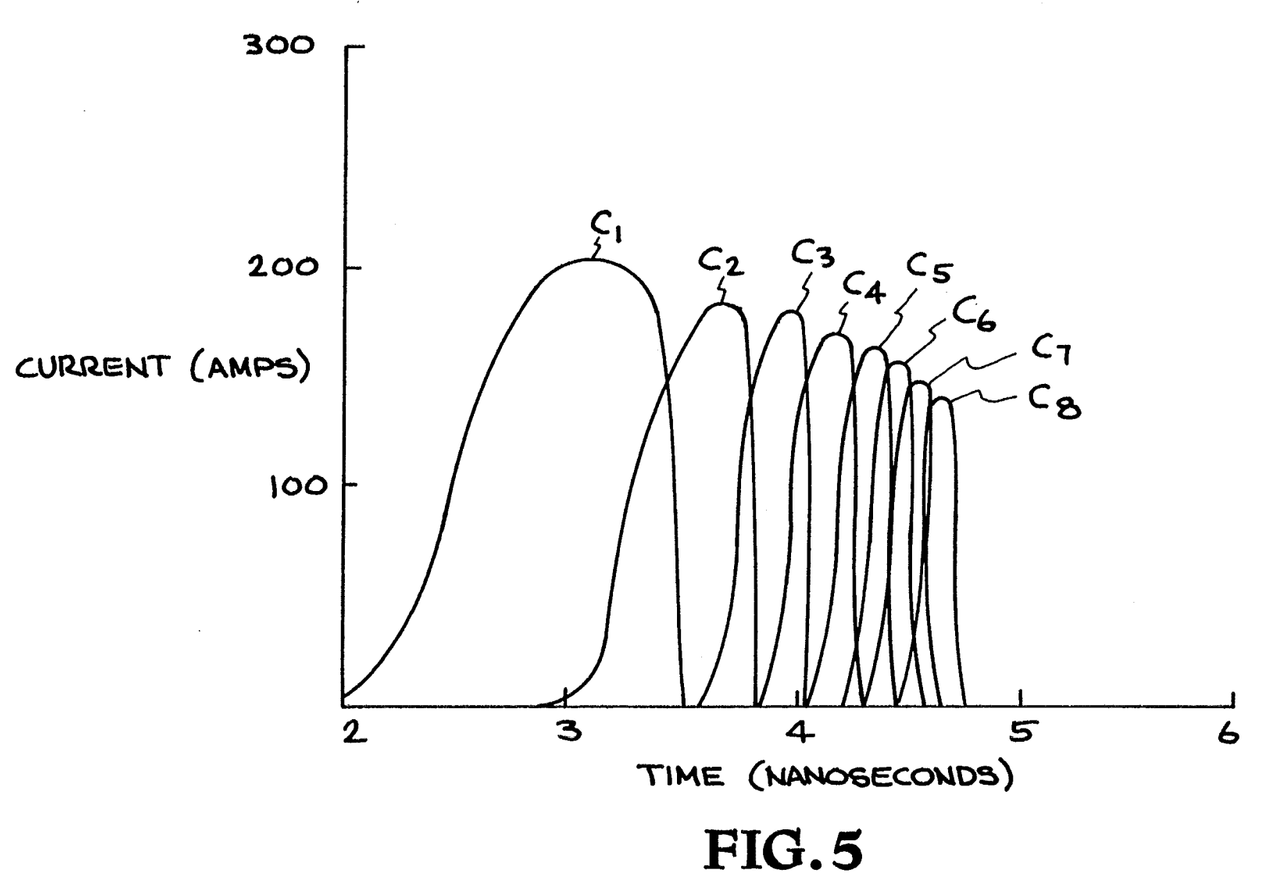
FIG. 5 is a graph of charging current at each stage capacitor in an avalanche transistor pulser string of eight stages.

FIG. 5 illustrates the respective capacitive charging current as a function of time for eight capacitors in an eight stage avalanche transistor stringed pulser, where the first capacitor $C_1$, is charged to a current carrying capacity of approximately 200 amps. Current carrying capacity on subsequent capacitors in stages 2 through 8 range between 180 to 140 amps but have little effect on total current output which is predominantly from $C_1$.

Figure 6:
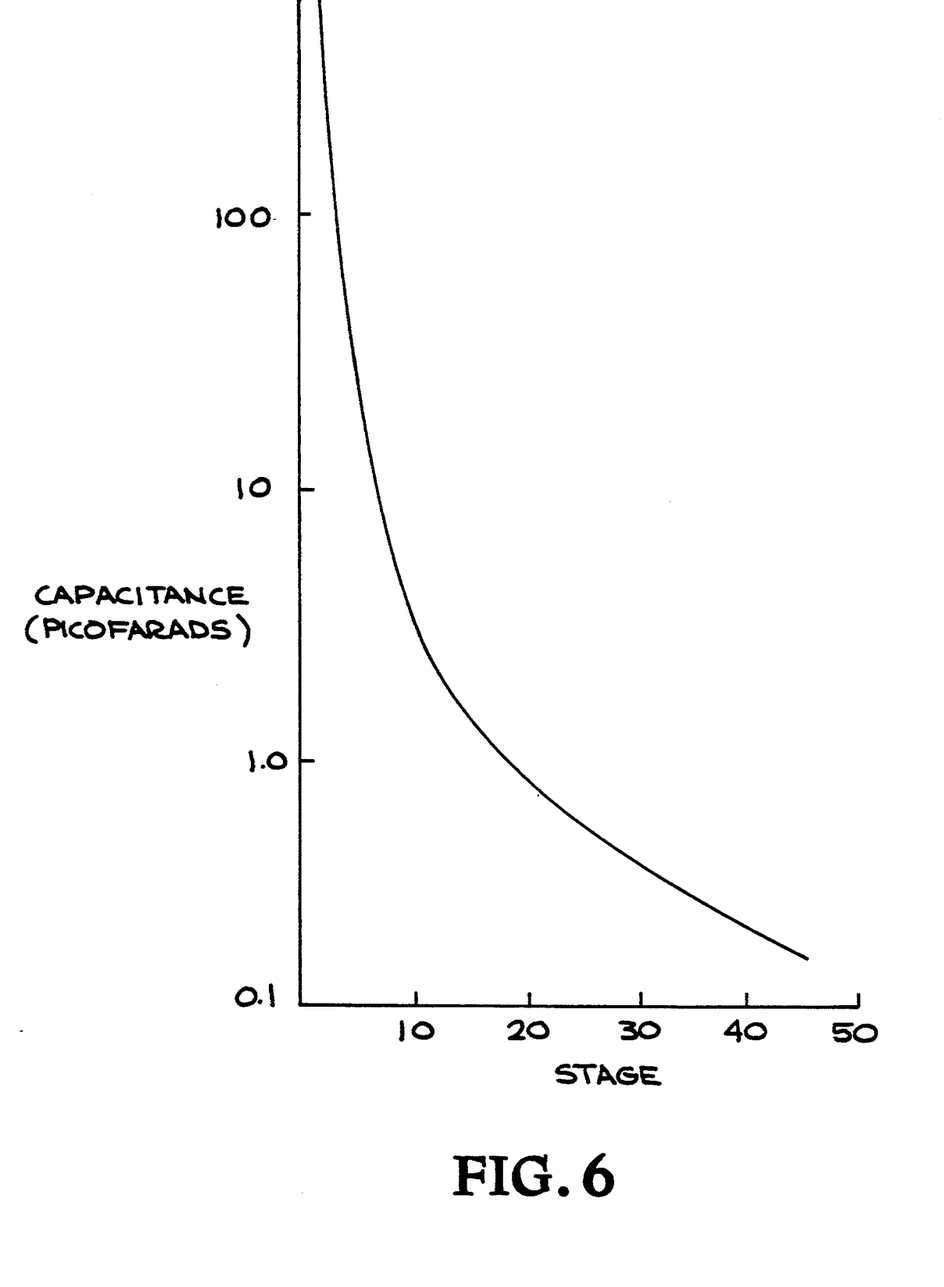
FIG. 6 is an extrapolated graph of capacitance per stage in a typical capacitively loaded avalanche transistor pulser string.

FIG. 6 illustrates stage capacitance as one might expect from extrapolation of short pulser strings into in excess of 40 avalanche transistor stages. As is apparent from FIG. 6 the current carrying capacity of capacitors in higher stages drops precipitously, geometrically, and asymptotically from the ordinate to the abscissa as the number of stages is increased.

Figure 7A:
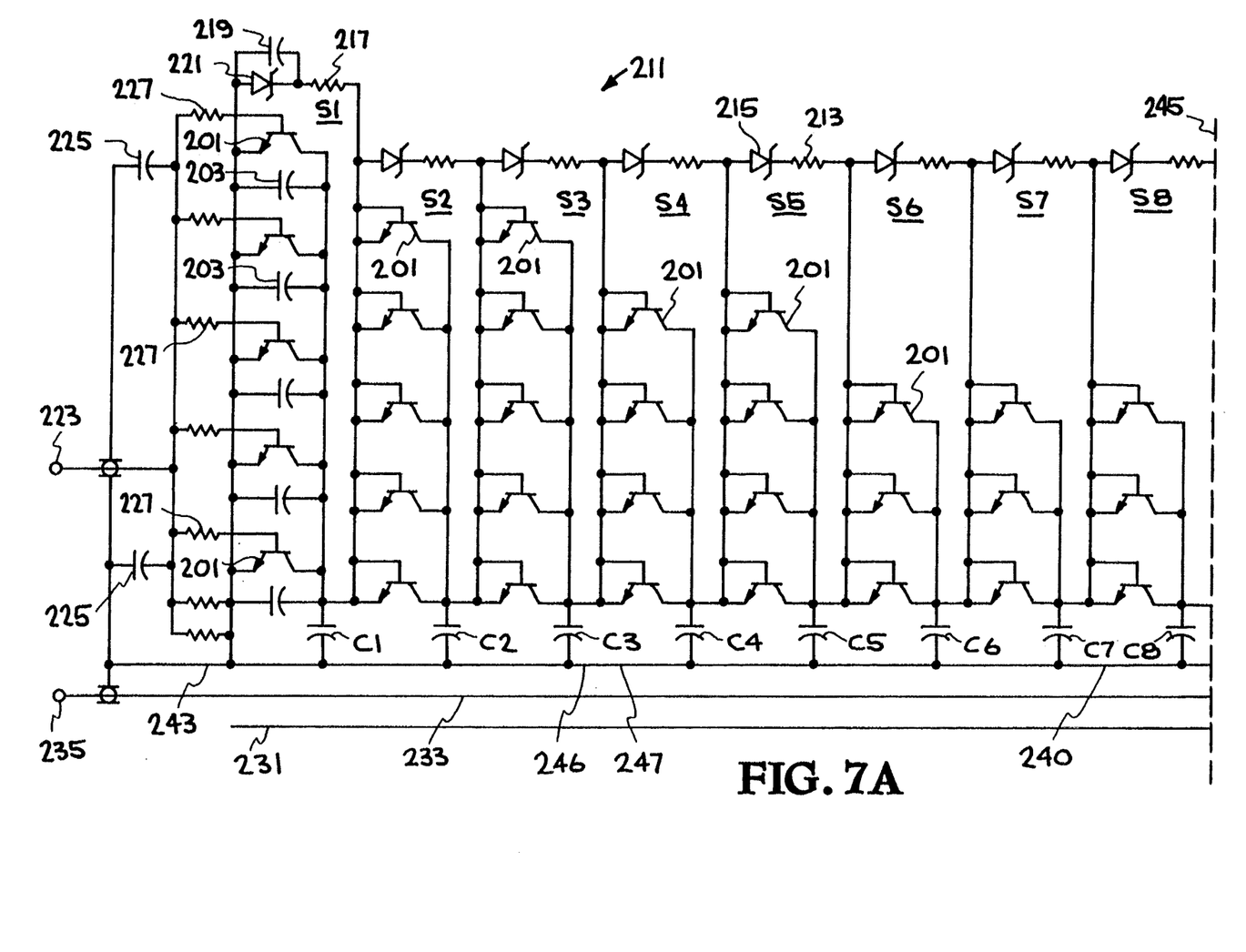
FIG. 7 is a schematic of a preferred embodiment of an avalanche transistor pulser string of twenty four stages.
Figure 7B:
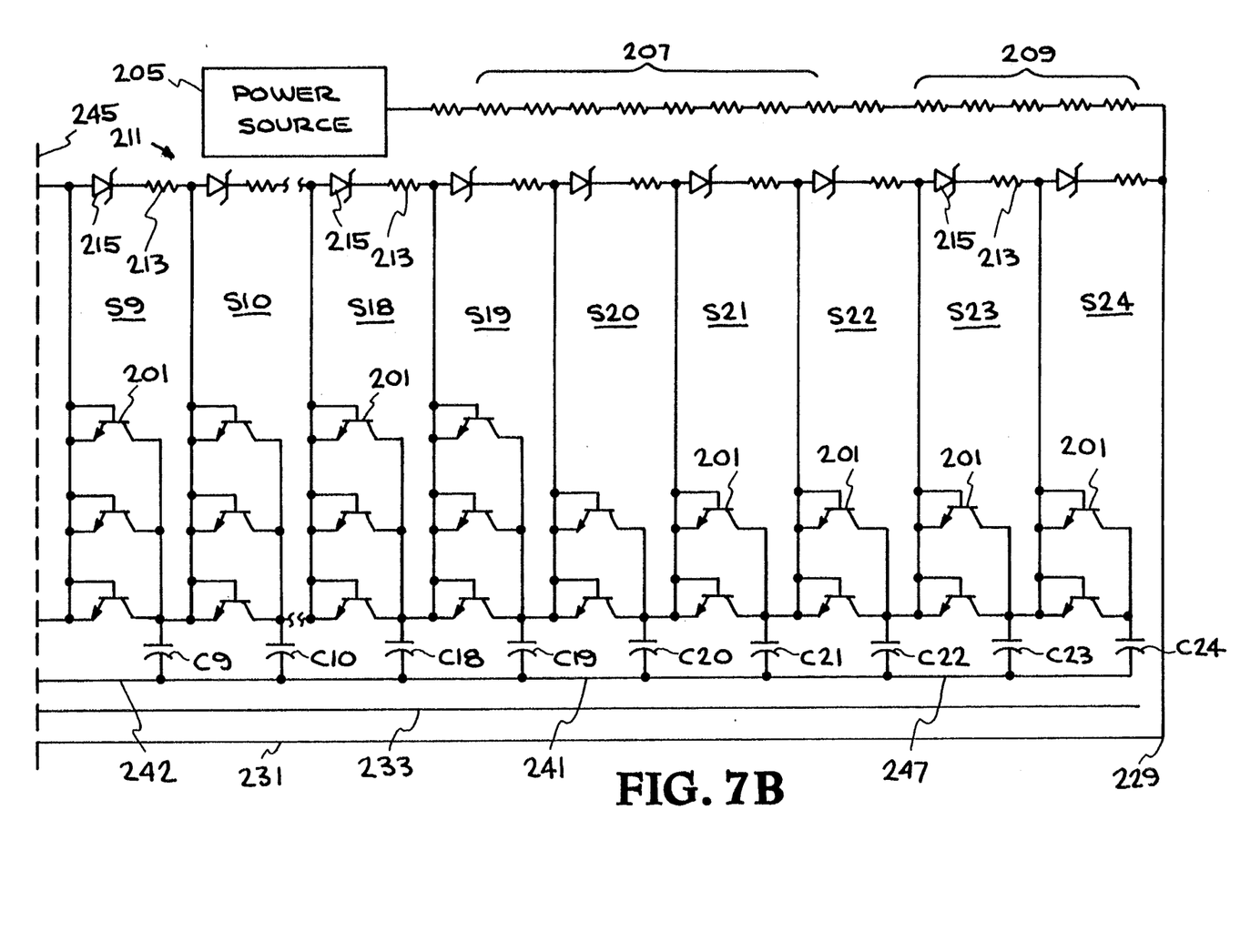

Referring now to FIG. 7, a schematic of the electronic circuit of a preferred embodiment of the lumped transmission line avalanche transistor pulse generator is illustrated. The embodiment described herein utilizes twenty four stages, $S_1$ through $S_{24}$, of stacked avalanche transistors, 201 (Zetex, FMMT417) wherein each stage is coupled in series to other stages as in the simple model of FIG. 3, and each transistor within each stages is wired in parallel with every other transistor in that stage; i.e. collector to collector, base to base and emitter to emitter, wherein the base of each individual transistor is also connected to the emitter of the same transistor as in FIG. 3.

The first three stages $S_1$, $S_2$ and $S_3$ contain five stacked avalanche transistors 201 in each stage; stages S4 and S5 contain four avalanche transistors 201 each; stages $S_6$ through $S_{19}$ contain three in each stage; and stages $S_{20}$ through $S_{24}$ contain two in each stage. The purpose for stacking avalanche transistors 201 in parallel within each stage is to provide greater current carrying capability for each respective stage of the pulse generator. The intent in diminishing the number of avalanche transistors 201 per succeeding stages arises from the need to provide a constant current flow along the pulser string from $S_1$ through $S_{24}$. In consideration of the cumulative contribution of current from each stage together with the fact that less current is being provided each stage along the string, it is desirable to stack transistor 201 in diminishing stages as illustrated in FIG. 7.

Each stage $S_1$ through $S_{24}$ is provided with its respective balanced capacitor C1 through $C_{24}$, with a decrease in capacitance per stage from C1 to $C_{24}$ as follows in pico farads (pF): 580, 220, 95, 35, 17, 9.0, 3.0, 3.0, 3.7, 2.8, 1.9, 1.5, 1.3, 1.20, 1.02, 0.94, 0.66, 0.79, 0.74, 0.70, 0.66, 0.63, and 0.60. As is more readily apparent from a review of the graph of FIG. 5, the initial capacitor $C_1$ is by far the largest capacitor and provides the majority of current (200 Amps) flowing through $S_1$, and the entire pulser circuit. Capacitance values in the string series do not necessarily decrease in an orderly manner. Because any individual stage may consists of two or more avalanche transistors, in series or in parallel, some stage capacitance values may be larger in a later stage than an earlier stage. If necessary for matching, small capacitors may be added between stages. Determining ideal capacitance values for each stage is part theoretical and part trial and error.

It is indeed the RC balanced variable capacitively loaded string of avalanche transistor stages that is novel and that enables the string pulse generator to achieve the significantly high performance and high efficiency desired. The capacitance for each stage must be accurately balanced with the circuit and stage time requirements in view of the inductive and resistive effect of the avalanche transistor.

Avalanche transistors have several switching modes. One such mode is the standard gate trigger or slow, over-voltage made with risetimes down to approximately 500 pico seconds (ps). Another mode, with switch risetimes less than 100 ps, can be triggered by voltages around zener voltage levels or higher and a pulse current above some given amount in the range of 10 to 100 amps. An avalanche transistor pulse generating circuit capable of achieving 100 to 200 ps risetime may require a bandwidth response to roughly 5 GHz. That is why switching modes of the transistors have to be taken into consideration in determining stage capacitance values.

The foregoing capacitance values $C_1$ through $C_{24}$ for each stage $S_1$ through $S_{24}$ have been determined to be suitable values to achieve the fast switching mode desired. Again, the capacitance value for $C_1$ is large for the first stage $S_1$ because a relatively large capacitor is needed to provide the low dynamic impedance at that point in the circuit and to provide a substantial current source to allow the avalanche transistors in stage $S_1$ to turn on hard. As the capacitance decreases in succeeding stages $C_2$ to $C_{24}$, the dynamic impedance for each respective stage increases proportionately.

All capacitance loaded avalanche transistors in each stage tend to turn on very hard which results in a voltage drop across the avalanche transistors with high current efficiency. With properly loaded avalanche transistors of 250 Volts or more, a 310 volt drop across each respective stage will produce transients with 80% of the input voltage seen at the output, which effectively yields flat topped pulses with low heat dissipation in the avalanche transistors.

Referring again to FIG. 7, first stage $S_1$ contains five additional 60 pF capacitors 203 coupled across each of the five avalanche transistors 201 to provide an initial current boost in the first stage, in addition to that provided by $C_1$.

A 7.5 kVolt external high voltage power source 205 is connected to the pulse generator through an initial pack of ten resistors 207, (5.1KΩ, 0.25 Watt each) which serve as a pulser current limiting resistor pack, and a second group of five resistors 209, (200KΩ, 0.125 Watt each) which function as a transient current limiting resistor pack. Power is applied to each stage across a power lead 211 of alternating 12KΩ resistors 213, and zener diodes 215 (1N5111) for each stage. Each zener diode 215 causes a 310 Volt drop across each stage such that the potential across $S_1$ at zener diode breakdown is 310 volts, $S_2$ is 620 volts, $S_3$ is 960 volts, S4 is 1240 volts and so forth down to $S_{24}$ at 7440 volts.

Each resistor 213 in power lead 111 is 1KΩ and is associated with each zener diode 215 per stage to inhibit current surge through diodes 215 in each stage $S_1$ through $S_{24}$, when the diodes see voltage drops across their respective stage avalanche transistors from 300 volts to 50 volts on transistor discharge. First stage $S_1$ includes a first surge limiting resistor 217 of 100KΩ, which in addition to limiting current surge through diode 221 also reacts with capacitor 219 as an RC filter for first zener diode 221.

A 50 V trigger input 223 is applied to the base of each avalanche transistor 201 of first stage $S_1$ through a pair of 1.2 pF, 500 Volt, parallel standoff capacitors 225 and five parallel 27 Ω resistors 227 for fine tuning the first stage avalanche transistors.

Output of the avalanche transistor pulse generator at point 229 is split between a 25 Ω charge line 231 and a 25 Ω stripline 233. Stripline 233 is connected to a 25 Ω output connector 235. Charge line 231 is a strip of copper leaf the length of which may be adjusted to vary output pulse width. The function of charge line 231 is to set an output pulse width at a desired value in a range of 2 nanoseconds (ns) to 100 pico seconds (ps) which interval is exactly twice the transit time of a signal in charge line 231, typically 1 ns to 50 ps. Corresponding pulse amplitude at output terminal 235 will roughly be 50% of the avalanche transistor pulser string at point 229.

Stripline 233 actually consists of two 25 Ω striplines. One such stripline consists of output lead 233 and a common lead 241 connected in series between the pulser output point 229 and a common lead point 243. The second stripline configuration consists of charge line conductor 231 and output lead 233. The insulated, dielectric area between output lead 233 and common lead 241 consists of conventional 0.032 double sided PC board dielectric with a 25 Ω impedance, and the insulated dielectric area between output lead 233 and charge line 231 consists of three layers of Kaptan tape with a 25 Ω impedance.

Common lead 241 consists of a brass back plane 240 covered with Dupont Pyrolux bonded Kaptan and coupled to a copper leaf back plane 242 which is continued on a PC board 247 and folded along dotted line 245 at the PC board transition point under brass back plane 240. Variable capacitors $C_1$ through $C_8$ are formed by attaching rectangular leafs of copper 246, decreasing in size from $C_1$ to $C_8$, to the kaptan surface 247 between copper leaf 246 and brass back plane 240. Capacitors $C_9$ through $C_{24}$ are likewise formed by attaching still diminishing sized, rectangular shaped copper leafs on the surface of PC board 247 the reverse side of which is copper leaf back plane 242.

With the foregoing embodiment in mind it would be apparent to one skilled in the art that a high power pulse generator of a compact configuration with efficiency of greater than 50% can be attained, that the pulse width can be changed as desired by increasing or diminishing the length of charge line 231, and that the limited amount of stored energy in the pulse generator configuration diminishes the amount of component damage if a failure occurs.

It should also be apparent in the above description that a constant current along a stringed pulser permits the most efficient pulse generation and that an avalanche string pulser of the manner disclosed herein will transmit a constant current along the string equal to or greater than the output current. The stage impedance necessary to continue propagation of the constant current is set by the interrelationship of each stage, $S_1$ through $S_{24}$, capacitance and stray inductance from respective transistors.

It is also understood that the pulse generator with the specific values as described hereinabove is merely an illustration of the principles of the present invention. Various changes may be made without departing from the spirit and scope of the invention. Thus, for example, any number of stages or transistors and capacitors within each stage may be added or deleted for further increasing the output or efficiency of the pulse generator.

I claim:

1. A lumped transmission line pulse generator, comprising:
    a plurality of avalanche transistors (AT) coupled in a series of one through "n" stages along said transmission line, each said AT having collector, base and emitter terminals;
    a zener diode (ZD) coupled across each said AT within each said stage;
    a resistor (R) in series with each said ZD in each stage, the resistor in the last stage being coupled to a high voltage power source (HV) to produce a voltage across each stage;
    a capacitor (C) in each said stage coupling said collector of each said AT and said voltage to a common lead; and
    a trigger circuit coupled across said base and emitter of a first AT in said first stage.

2. A pulse generator according to claim 1, wherein each said capacitor associated with each said stage decreases in capacitance along said AT series beginning with said first stage and ending with said $n^{th}$ stage.

3. A pulse generator according to claim 2, wherein each said capacitor in each said stage is balanced with said AT in each said stage to supply sufficient current to enable a constant current flow.

4. A pulse generator according to claim 3, wherein each said capacitor in each said stage is balanced with each said AT and each said resistor in each said stage to achieve a low RC time constant and a corresponding fast turn-on of each said AT into a low impedance conducting state.

5. A pulse generator according to claim 4, wherein inductance across each said AT is minimized by using capacitors made from printed circuit type pads with very thin dielectric thickness.

6. A pulse generator according to claim 5, wherein each said AT is surface mounted on top its respective capacitor which in turn is surface mounted to a PC board having a ground plane disposed on the opposite side thereof, thereby placing said AT close to said ground plane to reduce inductance in said AT.

7. A pulse generator according to claim 1, wherein each said zener diode and respective series resistor for each said stage is coupled through a continuous series string of alternating zener diodes and resistors to said HV.

8. A pulse generator according to claim 1, wherein the base of each said AT is coupled to the emitter of the same AT.

9. A pulse generator according to claim 1, wherein the emitter of said first AT is coupled to said common lead.

10. A pulse generator according to claim 9, wherein the emitter of each succeeding AT is coupled to the collector of the immediately preceding AT.

11. A pulse generator according to claim 1, wherein the number of stages comprises at least twenty-four.

12. A pulse generator according to claim 1, wherein each said stage comprises a plurality of AT coupled in parallel.

13. A pulse generator according to claim 12, wherein said parallel coupled AT's in each said stage diminishes in number from said first stage to said $n^{th}$ stage to accommodate a greater current flow in the initial stages and a lesser current flow in the final stages to yield a constant current flow output.

14. A method for producing a high voltage, short duration pulse with a high and constant current, comprising the steps of:
    implementing a lumped transmission line of series coupled one through n stages;
    providing at least one avalanche transistor per stage;
    providing an increasing power supply to each succeeding stage; and
    incorporating a decreasing capacitive element per stage balanced with respect to inherent inductive and resistive effects of the respective avalanche transistor to yield an increasing stage impedance and constant current along said transmission line equal to or greater than the output thereof.

* * * * *